United States Patent [19]
Lind et al.

[11] Patent Number: 4,914,639
[45] Date of Patent: Apr. 3, 1990

[54] SONAR DOPPLER SYSTEM WITH A DIGITAL ADAPTIVE FILTER

[75] Inventors: Earl R. Lind, Portsmouth; Francis C. Jarvis, Barrington, both of R.I.

[73] Assignee: Raytheon Company, Lexington, Mass.

[21] Appl. No.: 287,709

[22] Filed: Dec. 19, 1988

Related U.S. Application Data

[63] Continuation of Ser. No. 262, Jan. 2, 1987, abandoned.

[51] Int. Cl.$^4$ .............................................. G01S 15/58
[52] U.S. Cl. .................... 367/91; 364/724.19
[58] Field of Search ................... 367/90, 91; 342/104, 342/106, 115, 117; 364/565, 566, 572, 724.19

[56] References Cited

U.S. PATENT DOCUMENTS 3,893,076  7/1975  Clifford ................................. 367/91
3,898,878  8/1975  Stallworth et al. ............... 367/91 X
3,908,116  9/1975  Bjornsen ........................ 364/572 X
4,369,444  1/1983  Blumling ........................ 364/565 X
4,580,275  4/1986  Pirani et al. .................... 364/724 X
4,608,568  8/1986  Egawa .............................. 367/90 X Primary Examiner—Thomas H. Tarcza
Assistant Examiner—Daniel T. Pihulic
Attorney, Agent, or Firm—Denis G. Maloney; Richard M. Sharkansky

[57] ABSTRACT

A doppler sonar speed measuring system incorporating a digital adaptive filter responsive to the difference in newly received raw speed data and previously received speed data to determine the amount and sign of change of the previously received data. The allowable amount of change increases to a maximum allowed value if the sign of the change remains the same on successive received data as under acceleration conditions and reduces to a minimum value when the sign changes on successive received data.

11 Claims, 4 Drawing Sheets

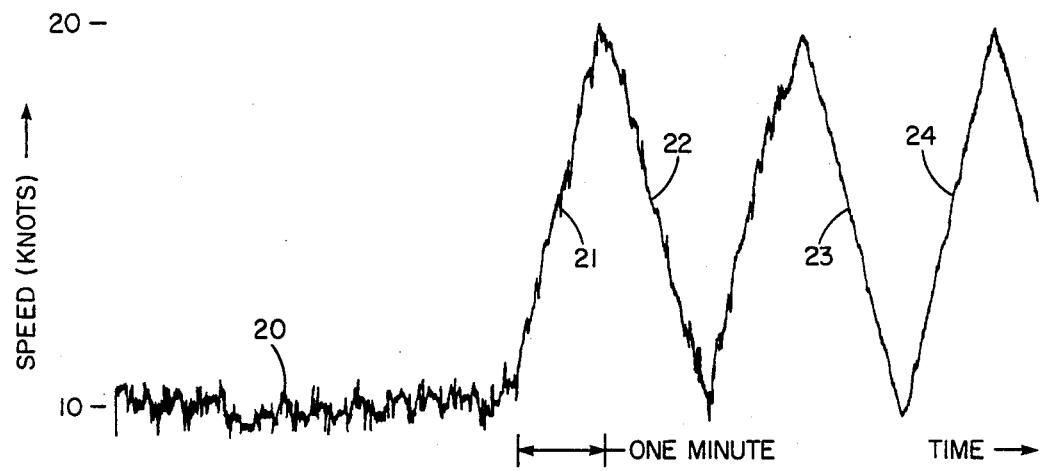
FIG. 1 - PRIOR ART
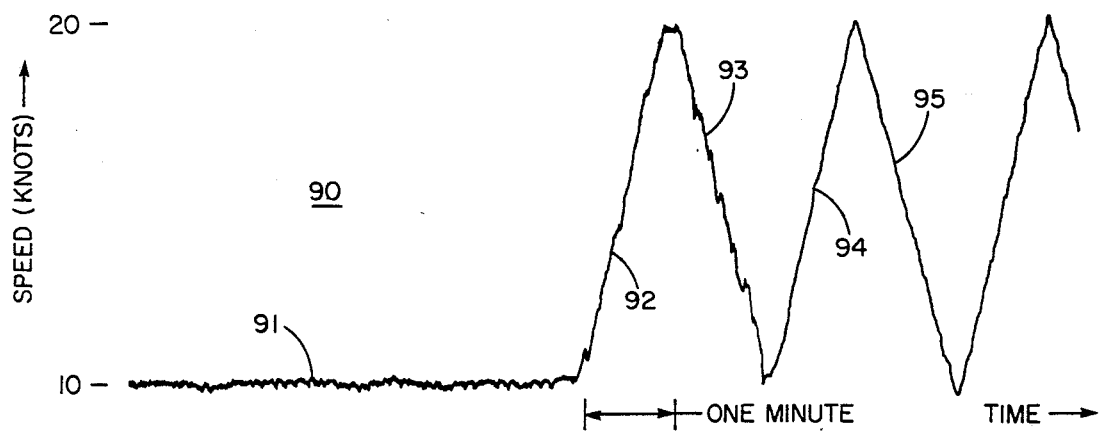
FIG. 5

SONAR DOPPLER SYSTEM WITH A DIGITAL ADAPTIVE FILTER

This application is a continuation of application Ser. No. 000,262, filed Jan. 2, 1987, now abandoned.

BACKGROUND OF THE INVENTION

This invention relates to doppler speed measuring system incorporating a digital adaptive filter device and more particularly to a ship-mounted speed measuring device where the device is capable of providing the velocity of the ship with an acceptable error under high rates of acceleration and also capable of providing smooth velocity data when the ship has a steady state velocity.

Doppler speed logs or measuring devices provide processed individual returns from a sonar signal which have considerable scatter in the computed velocity from pulse to pulse. There are a number of reasons why the computed or measured velocity has substantial variation from return to return. One reason is the finite beam width of the usual sonar speed measuring device which typically will provide a plus or minus 7.5 percent doppler spread. In addition, motions of the ship on which the doppler speed measuring device is mounted cause motions of the transducer (i.e. roll in athwartship direction, and pitch in the longitudinal direction). In addition, when the sonar speed detection relies upon the signal reflected from the water mass as when the ship is in deep water, there is an additional component of velocity spread produced by the motion of the water itself. Lastly, there is ambient noise which, in practice, produces the least amount of velocity uncertainty since operation is generally at high signal-to-noise ratios.

In order to smooth the data received from each sonar transmission, the data from a number of consecutive valid readings of the doppler speed were averaged prior to being provided as an output of the speed measuring device. For speed updates occurring approximately every five seconds and for repetition rates which would be low enough to avoid multiple signals being returned from reflecting surfaces during the interpulse interval, the number of pulse returns which were averaged would typically be nine or thirty-six returns. The average signal would also be subjected to fixed slew rate limits of 0.1, 0.2, 0.3, or 0.4 knots for every five second update. Thus, the velocity of the ship presented at the output of the doppler measuring device could not vary more than the slew rate limit from output to output at the five second rate. Virtually all ships used the 0.1 knot velocity change for the maximum velocity change per five second upward velocity update. For large commercial vessels which had low accelerations, this low slew rate of 0.1 knots per second was acceptable to adequately follow accelerations and to provide speed data that was substantially constant for constant speed operation.

For those ship installations where the acceleration of the ship could not be followed by a 0.1 knot per second velocity update at the five second update rate, the doppler speed measuring devices were found to be lacking in the presentation of accurate speed information under high acceleration rates even though the velocity readings under steady state conditions were acceptable. To remedy this deficiency, the system cycle update rate was increased to substantially one update per second thereby reducing the number of sonar doppler returns which were averaged by a factor of four to provide nine returns per cycle thereby causing the raw data being processed by the doppler speed measuring device to have substantially greater variation in doppler frequency on each update. A binary adaptive filter was added to allow the speed measuring device to track accelerations up to 20 knots per minute with acceptable lag. The binary adaptive filter had the capacity for providing four slew rates of 0.1, 0.2, 0.4, and 0.8 knots per update.

The binary adaptive filter operated in the following manners. If it is assumed that the past speed reading was $V_{N-1}$ knots and the gate width was $G_{N-1}$ knots per update, the first step would be to subtract the past speed reading, $V_{N-1}$, from the present reading, $V_N$, thereby providing an output $\Delta_N$ difference speed in knots. If $\Delta_N$ exceeded $G_{N-1}$, then the output would be $V_{N-1}+G_{N-1}$ if $\Delta_N$ was positive, and $V_{N-1}-G_{N-1}$ if $\Delta_N$ was negative. In either case, since $\Delta_N$ exceeded $G_{N-1}$, the filter would increase the value of $G_{N-1}$ to the next highest allowed value for the processing of the next return signal. Alternatively, if $\Delta_N$ was less than $G_{N-1}$, the present speed reading $V_N$ would be outputted and the gate value $G_{N-1}$ would be changed to the next smaller increment. If $\Delta_N=0$, the output speed would be unchanged and the gate $G_N$ would be reduced by one increment. This selection process of providing an updated speed output and changing of the gate value would continue for each cycle of the speed measuring system.

A filter built to follow the preceding rules of operation attempts to reduce the slew rate down to the lowest value of 0.1 knots per update during constant speed running. When an acceleration or deceleration occurs, the filter opens up the gate width in order to attempt to track the velocity change with an acceptable error. However, the scatter in the raw velocity readings provided to the filter even at constant speed running following acceleration or deceleration results in keeping the gates open to a value greater than desired. Thus, the digital speed display shows excessive variation in velocity on each update. As a result, users of the speed measuring device using the filter just described find its presentation to be unacceptable because the displayed velocity perturbations run counter to the expected constant velocity of the ship which is cruising with constant engine rpm's. FIG. 1, plot 20, shows the output speed variation as a function of time of this prior art filter for a simulated signal provided in the laboratory in which an FM oscillator was provided to the doppler system which simulated a speed of 10 knots with a plus or minus 2 knot variation at a one second rate. The plots 21, 22 is the output speed when simulating acceleration/deceleration, respectively, from 10 to 20 knots in one minute with a plus or minus 2 knot speed variation. The speed output plots 23, 24 were obtained with an acceleration/deceleration, respectively, of 10 to 20 knots in one minute with no variation in speed during the acceleration period. It is noted that even under cruising conditions when the speed should be constant at 10 knots, the output speed readings have undesirable fluctuations of about plus or minus 0.5 knot relative to the 10 knot average speed.

SUMMARY OF THE INVENTION

It is therefore a primary object of this invention to provide a speed measuring device in which the variation in output speeds when the ship is in the cruise or steady speed condition is reduced to a value which corresponds to speed variations of 0.1 knot maximum per system cycle such as was previously attainable by manual control of the speed gate width while at the same time retaining the acceleration following capabilities of the prior art filter. This and other objects are obtained by providing an improved digital adaptive filter in a sonar doppler system which detects from the measured velocities whether the ship is undergoing acceleration or is in a cruising condition to automatically adjust the velocity gate to reduce the gate width and hence speed variations when in the cruising status; while opening the gate when the raw speed data indicates that there is an acceleration or deceleration condition, thereby reducing the lag in the displayed output velocity indicated by the measuring device relative to the true velocity under accelerating conditions. In order to accomplish this result, the digital filter in a sonar doppler system of this invention detects the sign of the error between the raw velocity data and the data which was provided by the device on the previous cycle to determine whether and by how much the velocity gate should be opened or closed. If there is a sign change, the filter closes the velocity gate so that the maximum change per cycle is only 0.1 knot per cycle whereas when there is no change in the sign the filter increases or decreases the velocity gate in a programmed manner.

BRIEF DESCRIPTION OF THE DRAWINGS

The aforementioned aspects and other features of the present invention will be apparent from the following description taken in conjunction with the accompanying drawings wherein:

FIG. 1 is a plot of indicated output speed under constant speed and acceleration/deceleration using a prior art filter in a doppler speed measuring system;

FIG. 5 is a plot of the displayed speed output provided by the digital adaptive filter under the same input conditions as that for FIG. 1.

DESCRIPTION OF THE PREFERRED EMBODIMENT

Figure 2:
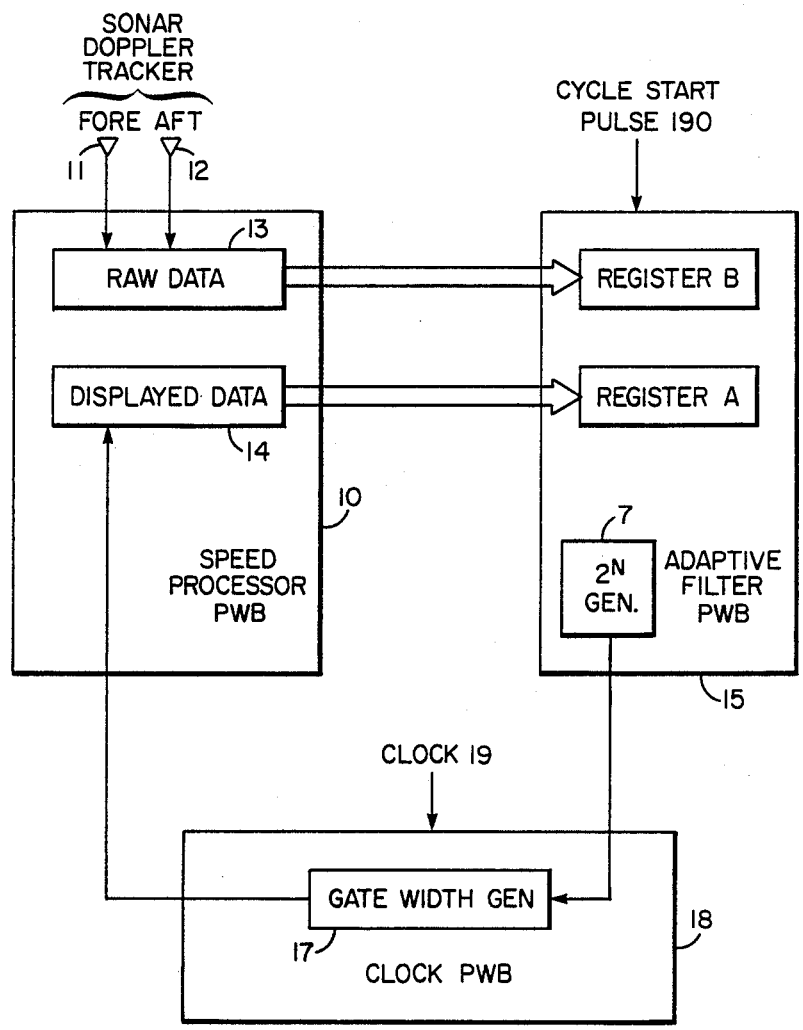
FIG. 2 is a block diagram showing the interconnection of the adaptive filter of this invention with components of a prior art doppler speed measuring system.

A doppler speed measuring system utilizing the digital adaptive filter of this invention is capable of following accelerations of up to 20 knots per minute while at the same time providing a digital display which does not provide excessive variations in indicated speed when the ship is operating at constant speed. The digital filter is designed to limit the variation in velocity presented on the digital display to 0.1 knot whenever the difference between the previous value of the digital display speed and the incoming raw data signal has a value which changes polarity, i.e. the error signal changes from a positive to a negative value or vice versa. In operation, if the ship is accelerating, the displayed velocity provided by the speed measuring device will trail the actual ship velocity in which case the successive error signals do not change sign and the filter velocity gate is automatically opened in order to allow the digital display speed value to catch up with the actual ship velocity in a relatively small number of update cycles of the speed measuring system. During the acceleration or deceleration mode, the error signals do not change sign and the allowable change in velocity provided by the digital filter is increased in accordance with the amount by which the velocity gate is increased. During constant speed running, the indicated speed of the digital display is allowed to change by only a small velocity gate valve for each cycle in a direction opposite to that of the previous cycle and the output speed displayed is substantially smoother.

The digital filter used in the doppler speed measuring device operates with the following mode of operation where it is assumed that the last speed reading was $V_{N-1}$, the gate width was $G_{N-1}$, and the sign of the change in speed which produced the speed reading $V_{N-1}$ is known. This change is designated $\Delta_{N-1}$. The following steps are provided by the digital filter.

Step 1: Subtract the previous displayed value of speed $V_{N-1}$ from the new speed value $V_N$ provided by raw speed data of the doppler speed measuring device to obtain the difference value $\Delta_N$.

Step 2: Determine if $\Delta_N$ has the same or opposite sign from the speed difference of the previous cycle $\Delta_{N-1}$.

Step 2A: If N has the same sign as $\Delta_{N-1}$, proceed to step 3A, B, or C.

Step 2B: If the sign is opposite, proceed to step 5.

Step 3A: If $\Delta_N$ exceeds the gate value $G_{N-1}$ stored in the digital filter, the digital filter is to provide an output speed reading $V_N = V_{N-1} + G_{N-1}$ and the gate value is increased to $G_N$ by the next higher allowable increment.

Step 3B: If $\Delta_N$ is less than $G_{N-1}$, the value $V_N$ is provided on the digital speed display and the gate $G_{N-1}$ is decremented by the next lower allowable decrement value to the new value $G_N$.

Step 3C: If $\Delta_N = 0$, use $V_N = V_{N-1}$ as the digital display data and decrement the gate $G_{N-1}$ to the lowest allowable value $G_N$.

Step 4: Proceed to obtaining the velocity $V_{N+1}$ by repeating Step 1.

Step 5: Since the sign of the error $\Delta_N$ is changed from that of $\Delta_{N-1}$:

Step 5A: If the error $\Delta_N$ is toward a slower speed, then set $V_N = V_{N-1} - 0.1$ knot.

Step 5B: If error is toward faster speed, then set $V_N = V_{N-1} + 0.1$ knot. In both instances 5A, 5B set the gate width $G_N$ at 0.1 knots and retain the sign of the last error $\Delta_N$.

Step 6: Proceed to $V_{N+1}$ by returning to Step 1 and repeating the process.

The adaptive digital filter of this invention was developed for use with an existing commercially available doppler system, the Raytheon DSL-250N, although the invention is not limited to utilization with that particular doppler system. A similar speed measurement system using doppler frequency with fore and aft transmitting and receiving transducers is described in U.S. Pat. No. 3,893,076, which is incorporated by reference in this patent application and forms a part hereof. The speed processor printed wiring board 10 of the prior art doppler systems is shown in block diagram form in FIG. 2. Fore and aft tracker signals 11, 12, respectively, which provide raw speed data in their respective directions are processed within the doppler system to provide doppler signals to board 10 which represent the raw data velocity of the ship on which the doppler system is being carried relative to a water mass or the ocean bottom. The raw data is perturbed from the true doppler data by errors generated by the pitching and yawing of the ship. This raw data is generated within the doppler system in a raw data register 13 once per system cycle. Also contained in the doppler system is a register 14 which contains the digital display data which is being presented to the user of the doppler system as a filtered version of the raw data contained in the register 13. The raw and displayed data in registers 13 and 14 are transmitted from the speed processor printed wiring board 10 to the adaptive filter printed wiring board 15. The adaptive filter board 15 contains registers B and A to which the raw data and displayed data, respectively, of speed processor board 10 are transferred by a cycle start pulse 190 which occurs at a period which is a multiple (nine or thirty-six in the Raytheon DSL-250N system) of the period at which signals are transmitted and received by the doppler system, which signals are averaged before being provided to the raw data register 13. The cycle start pulse 190 transfers the data stored in registers 13 and 14 to registers B and A, respectively, at the occurrence of a cycle start pulse. The adaptive filter 15 operates upon this data in a manner to be described subsequently to set the $2^N$ generator 7 to an N value of either 0, 1, 2, or 3. The set $2^N$ value of generator 7 is used to establish a gate width value on a gate width generator 17 which updates the display data register 14 and is stored in the generator 7 (a right/left shift register) for use on the next system cycle. The gate width is either 1, 2, 4, or 8 microseconds. The gate width generator 17 is located on a clock printed wiring board 18 of the DSL-250N doppler system. The gate width of generator 17 is used in conjunction with the clock 19 to increment or decrement the displayed data value in register 14 by 1, 2, 4 or 8 clock pulses just prior to the next system cycle start pulse, the clock 19 being a one megacycle clock.

Figure 3:
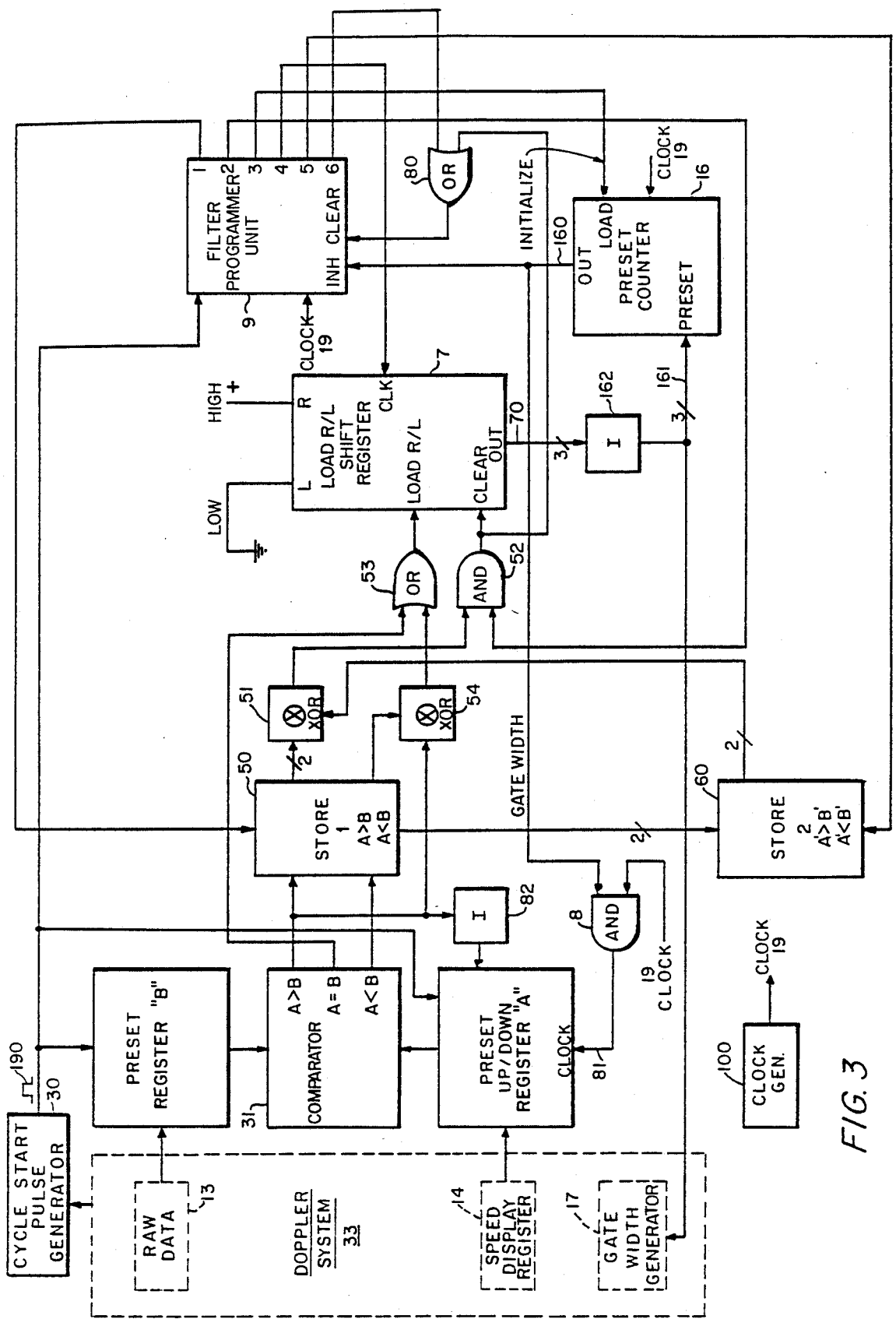
FIG. 3 is a block diagram of the digital adaptive filter of this invention.

Referring now to FIG. 3, the adaptive filter 15 operates in the following manner. The display data of register 14 and the raw data of register 13 are simultaneously transferred to the separate registers A and B, respectively, of the adaptive filter 15 once per system cycle in response to the cycle start pulse 190 produced by generator 30 in response to a predetermined number (typically nine) of sonar system transmit pulses 31. The data in registers A and B are compared in comparator 31 to determine if A>B, A=B, or A<B. The A>B and the A<B information is stored in store 50 and their values are compared by exclusive OR circuit 51 with the A'>B' and A'<B' values stored in store 60, where A' and B' represent the values of registers A and B which were stored at the end of the previous filter cycle. If the comparator 31 outputs are not the same on two successive cycles, the filter gate width $2^N$ provided on line 160 by preset counter 16 will be reduced from its last N value to N=0.

If there was no comparator 31 output change in the compared values of A and B on the preceding and present data readings, the A register is incremented or decremented by the $2^N$ value stored in the last filter cycle. Incrementing of the register A occurs if the value of speed recorded in register A is less than that of register B and vice versa. As the $2^N$ count of counter 16 is being clocked into register A, the output of register A is compared against the B register data, and if during the clocking operation the data in the two registers does not become equal, the stored N value in register 7 is increased to N+1 where N cannot exceed 3. If, however, the data in register A becomes equal to the data in register B during this clocking cycle, the clocking will stop at the A=B value and the $2^N$ value of register 7 will be reduced to $2^{N-1}$ where $N-1$ cannot be less than 0.

In either of the above conditions, the filter 15 will present the final N value stored in register 7 to the clock width generator 17 of the clock printed wiring board 18, store the resulting A>B and A<B values of store 50 for use as A'>B' and A'<B' in store 60 on the next filter cycle and then terminate the filter cycle of the programmer 9 until activated by the next cycle start pulse.

FIG. 3 shows a more detailed block diagram of the digital adaptive filter 15 of FIG. 2. Operation of the filter 15 is as follows. Initially, the raw data in a register of the doppler speed measuring system (a digital number measurement of the speed of the ship on which the system is located) and the displayed data in a register of the system (the filtered raw data) are provided to the preset register B and the preset up/down register A, respectively, in response to a cycle start pulse 190. The filter circuit 15 operates on the data in registers A and B as described in detail later to set the $2^N$ generator (or register) 7 to an N value of either 0, 1, 2, or 3. The $2^N$ value set in the generator 7 provided through inverter 162 and line 161 is used to establish a gate width value in preset counter 16 output 160 of either 1, 2, 4, or 8 microseconds depending on the $2^N$ value. The gate width $2^N$ is applied by counter 16 to an AND gate 8 whose other input is a clock signal from clock generator 100 whose frequency is 1 MHz. The output of AND gate 8 is applied as a clock input to up/down register A to cause register A to increment or decrement (depending on the output state of inverter 82) the displayed speed on a visual digital output display unit 2 of the doppler system by 1, 2, 4, or 8 clock pulses which, for the units used in the speed measuring device corresponds to 0.1, 0.2, 0.4 and 0.8 knots, respectively. A cycle start pulse generator 30 is responsive to a predetermined number of pulses of the sonar pulse train 31 to provide a train of cycle start pulses 190 on line 32. Typically, there will be nine sonar pulses for every cycle start pulse and the raw data provided to register B by the sonar system is an average of the nine doppler returns which satisfy certain pre-established reliability criteria of the doppler system 33. The cycle start pulse 190 on line 32 from generator 30 loads the raw data of register 13 into the preset register B, loads the display data of register 14 into the preset up/down register A, and initializes the filter programmer unit 9.

Figure 4:
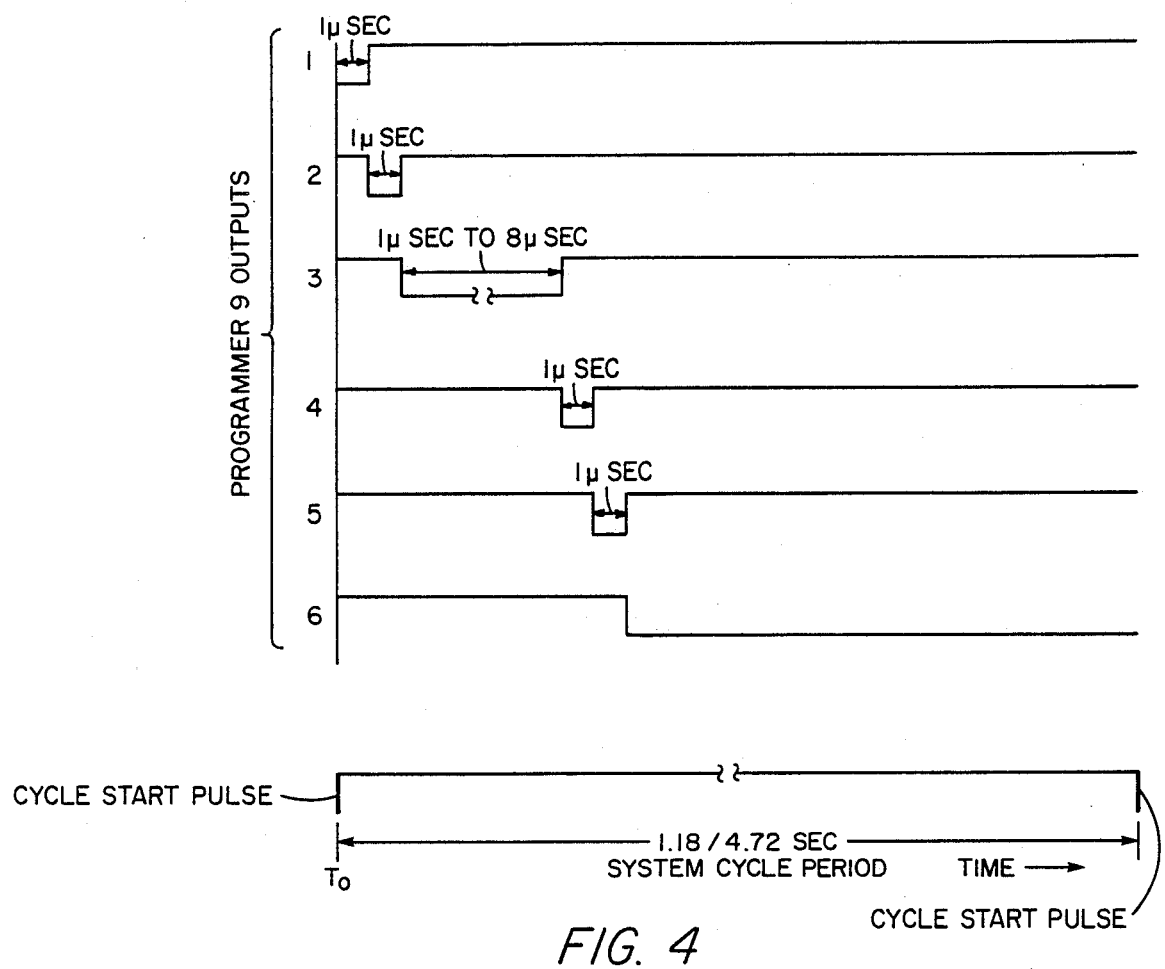
FIG. 4 is a timing diagram showing the output states of a programmer used in the digital adaptive filter.

FIG. 4 displays the timing sequence generated by the programmer unit 9. After the preset registers A and B are actuated by the cycle start pulse 190 on line 32 to accept the display data and to accept the raw data, respectively, the programmer 9 will provide a pulse at its output 1 to strobe store 50 which will store the states of the A>B, A<B outputs of the comparator 31. At this time, the previously stored outputs from store 50 are exclusively OR'd in exclusive OR circuit 51 with the corresponding outputs, respectively, of store 60 data which was the state of the comparator 31 outputs on the previous cycle. If the output from the comparator 31 changes from A>B to A<B, or vice versa, the exclusive OR circuit 51 will have its output provide a signal level which together with the one microsecond pulse on output 3 of programmer 9 passes through the AND circuit 52 and clears the shift register 7 and the programmer 9 via the OR gate 80. Clearing the shift register 7 will cause the maximum allowable data change to be limited to 0.1 knots per update. Clearing of the programmer unit 9 returns the unit to time $T_0$ on the timing diagram of FIG. 4 from which the programmer unit 9 will await activation by the next cycle start pulse on line 32.

The exclusive OR circuit 51 comprises two conventional exclusive OR circuits (not shown). One of these exclusive OR circuits has the inputs A>B for two successive cycles. The other exclusive OR circuit has the inputs A<B for the same two successive cycles. The output of each of these exclusive OR's are combined in an OR circuit (not shown) before being provided to the AND circuit 52.

If the exclusive OR circuit 51 did not change its output, namely, either A>B was true on two successive cycles or A<B was true on two successive cycles, the programmer unit 9 will provide a pulse output on its output 3 to initialize the preset counter 16. The counter 16 will be preset by the pulse on output 3 to the number present on line 161 from the shift register 7 resulting from the last filter cycle. On being preset, the counter 16 presents an output signal on line 160 which inhibits the programmer 9 from changing the state of its pulse outputs until the counter 16 has been clocked down to its preset count. The gate width on line 160 generated by counter 16 is also provided to AND circuit 8 so that AND circuit 8 will allow 1, 2, 4, or 8 clock pulses into the preset up/down register A. The presetting of counter 16 is provided by a three bit number occurring on line 161 provided by the output of the shift register 7 after inversion by inverter 162 in order to provide the proper state polarity to counter 16. The register A in response to the gated clock pulses on line 81 will then either count up or count down dependent upon the state of the A>B output of the comparator 31 which is applied to the U/D terminal of register A through inverter 82. Thus, if the comparator 31 provides a signal at its A>B output terminal which indicates that the count in register A is smaller than in register B, the polarity of signal provided at the U/D terminal of register A will cause register A to increase by no greater than the number of clock pulses provided at its input line 81, and vice versa. If there is no change in the polarity of the comparator 31 output during the period which clock pulses are being provided on line 81, the load R/L input to register 7 from exclusive OR circuit 51 will cause the shift register 7 to be set so that the binary number output of the shift register output at terminal 70 will acquire an additional "1" at the time that shift register 7 is clocked by the pulse appearing at output terminal 4 of programmer unit 9. Programmer unit 9 is caused to advance to produce a pulse at its output 4 with the removal of the inhibit signal on line 160 at the time that preset counter 16 has completed its count. More specifically, the output pulse on output 4 of programmer unit 9 will clock register 7 causing the "1" to be added to the digital number appearing on the output line 70 of register 7. This additional "1" will cause the gate width provided by preset counter 16 to increase to $2^{N+1}$ from its previous $2^N$ value. If the digital number contained in shift register 7 was originally all "1's " on the three output lines at terminal 70, the addition of another "1" to the contents of shift register 7 has the effect of shifting a "1" out of one end of the register and inserting a "1" at the other end of the register. Thus, there is no change in the contents of shift register 7 and the gate width will remain fixed at its maximum value of 0.8 knot per update corresponding to the shift register 7 providing three "1's " on its three output lines.

If there was a change in the state of the A>B or A=B outputs during the clocking cycle of the preset counter 16, the load R/L input to shift register 7 will be set by OR gate 53 to a state which will cause the shift output of register 7 to add a zero to its least significant output digit on line 70 at the time register 7 is clocked by the pulse on output 4 of programmer unit 9. One input to OR circuit 53 is from the A=B output of comparator 31. The other input to OR circuit 53 is the stored state of A>B in store 50 and the A>B output terminal state of comparator 31 during the clocking interval discussed above, which are applied to exclusive OR circuit 54. The sequence of operations previously described will then occur, but the gate width provided by preset counter 16 will decrease by $2^{N-1}$ from the last gate width unless the shift register 7 already had contained all zeros on its three output lines at its output 70. In this case, the system update will stay at its minimum value of 0.1 knots meaning that only one clock pulse will be provided to up/down register A on the next cycle of the filter. At the transition of the pulse on terminal 4, the programmer unit 9 provides a one microsecond pulse on terminal 5 which transfers the store 50 A>B and A<B states to store 60. At the termination of pulse 5, pulse 6 from the programmer 9 resets programmer 9 via the OR circuit 80 until the next system cycle pulse 190 occurs. The newly derived $2^N$ value from register 7 is then presented to the system gate width generator 17 for updating the display register 14 prior to the next system cycle start pulse.

FIG. 5 shows the results obtained with the digital adaptive filter of this invention under the same conditions as presented in FIG. 1 which was obtained with the prior art filter. The plot 90 of FIG. 5 is an analog representation of the digital read out from the speed display 14 of FIG. 3 under different conditions of simulated sonar return signals. Portion 91 of the plot 90 shows the output of the display data for a 10 knot steady speed with ±2 knot variation at a one second rate. Comparison of plot 91 with plot 20 of FIG. 1 shows that at constant speed with the filter of this invention, a significant reduction, at least 3 to 1, in output speed fluctuation in register 14 is obtained when using the filter of this invention. The plots 92, 93 and 94, 95 for acceleration and deceleration between 10 and 20 knots in one minute with ±2 knot variation and with no variation, respectively, show that the filter of this invention and the prior art filter track equally well under acceleration conditions.

Having described a preferred embodiment of the invention, it will be apparent to one of skill in the art that other embodiments incorporating its concept may be used. It is believed, therefore, that this invention should not be restricted to the disclosed embodiment but rather should be limited only by the spirit and scope of the appended claims.

What is claimed is:

1. In a doppler sonar speed measuring system of the type having a sequence of transmitted pulse signals and a corresponding sequence of reflected pulse signals and providing a doppler frequency as unfiltered raw speed data to an adaptive filter, the filter providing filtered speed data, the filter improvement comprising:

pulse generator means for transferring said unfiltered raw speed data to a first register of an adaptive filter;

means for providing said filtered speed data in a second register of said adaptive filter;

means for comparing said data in said first and second registers;

means for establishing a value of allowed speed change for said filtered data for each comparison;

said allowed speed change being determined by the magnitude and sign of each comparison;

said allowed speed change being reduced to a minimum predetermined value when the sign provided by the comparison of the first and second registers changes from the sign of the previous comparison; and said second register thereby providing filtered speed data.

2. A method for filtering the raw data of each cycle of a sonar doppler velocity signal to provide a display value of doppler velocity comprising:

storing a previous raw value of velocity $V'_{N-1}$;

storing a previous filtered value of velocity $V_{N-1}$;

providing a velocity gate width of $G_{N-1}$;

obtaining the difference $\Delta_{N-1} = V_{N-1} - V'_{N-1}$ of said filtered value and said raw value of velocity;

determining the sign of the change in polarity of $\Delta_{N-1}$;

step A: measuring the new value of raw data velocity $V'_N$, and subtracting the previous filtered velocity value $V_{N-1}$ from $V'_N [\Delta_N = (V'_N - V_{N-1})]$ to obtain the sign and difference value of $\Delta_N = V'_N - V_{N-1}$;

step B: compare $\Delta_N$ with $\Delta_{N-1}$ to determine whether the sign has changed;

if the sign has not changed, determine whether $\Delta_N$ exceeds the value of velocity gate width $G_{N-1}$;

if $\Delta_N$ is greater than $G_{N-1}$, provide the filtered value of velocity $V_{N-1} + G_{N-1}$ to a first register and increase $G_{N-1}$ by the next higher allowable increment to $G_N$;

if $\Delta_N$ is less than $G_{N-1}$, provide the value $V'_N$ to the first register and decrement the gate value $G_{N-1}$ to the next lower allowable value $G_N$;

if $\Delta_N$ is zero, provide the value $V'_N$ to the first register and decrement the gate value $G_{N-1}$ to the next lower allowable level $G_N$ and retain the sign of the error $\Delta_{N-1}$ of the previous difference reading;

return to step A to repeat the process steps for the next raw data input $V'_{N+1}$ on the succeeding cycle to obtain the next filtered doppler speed value $V_{N+1}$;

if step B determines that the sign of $\Delta_N$ and $\Delta_{N-1}$ has changed, and if the difference is toward a slower speed, then make $V_N$ equal to $V_{N-1} - V_0$, is the smallest allowable change in display speed value, set $G_N$ to $V_0$, and retain the sign of the difference $\Delta_N$;

if step B determines that the sign of $\Delta_N$ and $\Delta N-1$ has changed, and if the difference is toward a faster speed, then make $V_N$ equal to $V_{N-1} + V_0$, set $G_N$ to $V_0$, and retain the sign of the difference $\Delta_N$;

return to step A to repeat the process steps for the raw data input on the succeeding cycle to obtain the next filtered doppler speed value $V_{N+1}$.

3. A doppler sonar speed measuring system comprising:

means for cyclically obtaining raw data corresponding to the measured doppler speed during one cycle;

means for filtering said cycled raw data to obtain cyclical filtered doppler speed data;

means for storing filtered doppler speed data from the cycle preceding said one cycle; said means for filtering comprising, means for comparing said raw data of said one cycle with said filtered data of said preceding cycle to provide a difference signal;

means for changing said stored filtered data to reduce said difference signal;

means responsive to said comparing means to determine if the sign of the difference signal amplitude has changed and to determine if said difference signal has been reduced to amplitude zero;

means responsive to said difference signal to stop said means for changing said stored filtered data in response to a zero amplitude output from said comparing means;

means responsive to said change in sign of said difference signal to limit the amount by which said means for changing can change the amplitude of said stored filtered data; and means for providing said stored filtered data as a speed value to a speed indicating device on each cycle.

4. A doppler speed measuring system of the type having a raw speed data register and an output displayed speed data register, where the displayed speed data is filtered raw speed data, the filter improvement comprising:

a preset register B;

an up/down register A;

a cycle start pulse generator means providing cyclic start pulses;

said start pulse generator means transferring said raw speed data to said preset register, in response to each start pulses;

a comparator means connected to the outputs of said registers A, B providing separate outputs for A>B, A=B, and A<B;

a programmer pulse means connected to said start pulse generator providing a sequence of one through six pulses in response to each start pulse;

a source of clock pulses;

a $2^N$ binary number generator where N is a decimal digit responsive to said fourth pulse from said programmer pulse means;

a preset counter set to the $2^N$ binary number provided by said generator and counted down by said clock pulses;

a first AND gate responsive to an output state of said preset counter decremented by clock pulses and responsive to said clock pulses and connected to said counter A to provide clock pulses to cause said counter to count in a direction determined by the state of a signal provided to the U/D terminal of said counter A by said comparator A>B output;

first and second storage means each storing the states of the A>B and A<B outputs of said comparator on successive first and second cycles, respectively, said first store being responsive to the first pulse produced by said programmer after activation by said cycle start pulse;

a first OR circuit;

a first exclusive OR circuit connected to the A>B and A<B outputs of said first and second storage means to provide an output signal to a first input of said first OR circuit;

a second exclusive OR circuit responsive to the A>B output of said comparator and the A>B output from the latest cycle of said first exclusive OR circuit to provide an output signal to a second input of said first OR circuit, the output of said first OR circuit being connected to the R/L terminal of said $2^N$ generator;

a second AND gate connected to the output of said first exclusive OR circuit and to the A=B output of said comparator to provide at its output a signal to the CLEAR input of said $2^N$ generator;

the output of said preset counter being provided as an input to the inhibit terminal of said programmer to prevent the programmer from providing a pulse from its fourth output terminal to clock said $2^N$ generator until the count-down of the count of said preset counter;

said programmer providing a pulse on its fifth output terminal to said second storage means at the termination of the pulse on the fourth output terminal to transfer the A>B and A<B outputs of the first storage means to said second storage means;

a second OR gate;

said programmer providing a pulse on its fifth output terminal at the termination of the pulse on the fourth output terminal to one input of said second OR gate, a second input of said second OR gate being connected to the output of said second AND gate, said second OR gate having its output connected to the CLEAR input of said programmer to put the programmer in a state where it is responsive to the next occurring cycle start pulse; and said preset counter providing a number representing the filtered speed data to said displayed speed register.

5. The system of claim 4 wherein said first exclusive OR circuit comprises third and fourth exclusive OR circuits;

the third exclusive OR circuit having its inputs connected to the A>B outputs of said first and second storage means;

the fourth exclusive OR circuit having its inputs connected to the A>B outputs of said first and second storage means;

a third OR circuit having inputs connected to the outputs of said third and fourth exclusive OR circuits;

the output of said third OR circuit being connected to one input of said second AND circuit.

6. In a sonar doppler speed measuring system which provides a succession of measured raw speed data and which provides a corresponding succession of filtered indicated speed data, the improvement comprising:

comparing the relative magnitude of a first filtered indicated speed data resulting from the filtering of a first occurring raw speed data with the relative magnitude of a second occurring raw speed data;

determining from said comparison whether there has been a reversal in said relative magnitudes; and limiting the amount by which said filtered indicated speed data changes in the direction of change of said second occurring raw speed data when said reversal occurs; and said filtered indicated speed data being provided by said system as an output speed signal.

7. The system of claim 6 wherein said comparing the relative magnitude comprises using a comparator whose output states change with the magnitude of the raw speed and filtered speed data.

8. Adaptive filtering for providing a sequence of filtered doppler velocity output signals from a corresponding sequence of unfiltered doppler velocity input signals provided by a sonar system, said filtering comprising the steps of:

a threshold signal having a plurality of prescribed values;

(1) determining a sequence of differences between an unfiltered signal and an immediately preceding filtered doppler velocity signal;

(2) determining changes or the absence of change in polarity of the sequence of the determined differences;

(a) if the difference is greater than said threshold value, increasing the output by said threshold value, and increasing the threshold value to a next larger prescribed value;

(b) if the difference is less than said threshold value, decreasing the output to the unfiltered value of velocity, and reducing the threshold to a next smaller prescribed value;

(c) if the difference is zero, providing the preceding output and reducing the threshold to a smallest prescribed value;

(3) determining if the difference is of the opposite polarity from the immediately preceding value;

(a) if the unfiltered value is smaller than said filtered value, decreasing the output by a minimum prescribed threshold value and reducing the threshold to its smallest prescribed value;

(b) if the unfiltered value is larger than said filtered value, increasing the output by a minimum prescribed threshold value, and reducing the threshold to its smallest prescribed value; and providing said filtered values of doppler velocity signals as an output of said sonar system.

9. A method for filtering unfiltered data of each cycle of a periodic doppler velocity signal to provide a corresponding filtered value of doppler velocity signal comprising:

storing a raw velocity value $V_N$;

storing a previous filtered velocity value $V_{N-1}$;

providing a velocity gate width of $G_{N-1}$;

step A: storing a new value of raw data velocity $V_N$, and subtracting the filtered velocity value $V_{N-1}$ from $V_N$ to obtain the sign and difference value of $\Delta_N$;

step B: compare $\Delta_N$ with $\Delta_{N-1}$ to determine whether the sign has changed;

if the sign has not changed, determine whether $\Delta_N$ exceeds the value of $G_{N-1}$;

if $\Delta_N$ is greater than $G_{N-1}$, provide the filtered value of velocity $V_{N-1}+G_{N-1}$ to a display register and increase $G_{N-1}$ by the next higher allowable increment to $G_N$;

if $\Delta_N$ is less than $G_{N-1}$, provide the value $V_N$ to the display register and decrement the gate value $G_{N-1}$ to the next lower allowable value $G_N$;

if $\Delta_N$ is zero, provide the value $V_N$ to the display register and decrement the gate value $G_{N-1}$ to the next lower allowable level $G_N$ and retain the sign of the error $\Delta_{N-1}$ of the previous difference reading;

return to step A to repeat the process steps for the next raw data input on the succeeding cycle to obtain the next filtered doppler speed value $V_{N+1}$;

if step B determines that the sign of $\Delta_N$ and $\Delta_{N-1}$ has changed, and if the difference is toward a slower speed, then make $V_N$ equal to $V_{N-1}-V_0$, where $V_0$ is the smallest allowable change in display speed value, set $G_N$ to $V_0$, and retain the sign of the difference $\Delta_N$;

if step B determines that the sign of $\Delta_N$ and $\Delta_{N-1}$ has changed, and if the difference is toward a faster speed, then make $V_N$ equal to $V_{N-1}+V_0$, set $G_N$ to $V_0$, and retain the sign of the difference $\Delta_N$;

return to step A to repeat the process steps for the raw data input on the succeeding cycle to obtain the next filtered doppler speed value $V_{N+1}$.

10. A sonar system for providing at its output of filtered doppler velocity output signals, said system including adaptive filtering for providing a sequence of filtered output signals from a corresponding sequence of unfiltered input signals provided by said sonar system, said filtering comprising the steps of:
(1) determining a sequence of differences between each one of the sequence of unfiltered signals and each corresponding one of a sequence of preceding filtered signals, each one of such differences having a magnitude and a sign;
(2) determining a change, or an absence of change, of the sign in the sequence of determined differences;
(3) modifying a predetermined threshold value and filtered output signal amplitude in accordance with the following criteria:
in response to the determined absence of a change in sign determining whether said difference magnitude is greater than, less than, or equal to a predetermined threshold value to correspondingly:
    (a) increase the threshold to a next higher value, decrease the threshold to a next lower value, or reduce the threshold to a lowest prescribed value; and
    (b) increase the filtered output signal amplitude by said threshold value, decrease said unfiltered signal amplitude, or leave the unfiltered signal amplitude unchanged;
in response to a determination of a change in sign in said determined differences, selectively decreasing or increasing the output signal in accordance with the change in sign; and
said filtering steps providing a filtered doppler velocity output signal from said sonar system.

11. A sonar system for providing at its output filtered doppler velocity output signals, said system including adaptive filtering for providing a sequence of filtered output signals and providing a corresponding sequence of prescribed threshold values each from a corresponding sequence of unfiltered input signals, said filtering comprising the steps of:
(1) determining a sequence of differences between each one of a sequence of unfiltered signals and a corresponding one of a sequence of preceding filtered signals, each one of such differences having a magnitude and a sign;
(2) determining a change or an absence of change of sign in each of the sequence of determined differences;
(3) in the absence of a change in sign between two successive determined differences, then determining whether said difference magnitude is greater than, less than, or equal to a predetermined threshold value in which case the threshold is increased, decreased, or reduced to a next higher, a next lower, or the lowest prescribed value, respectively, and the filtered output signal is increased by said threshold value, decreased to said unfiltered signal amplitude, unchanged, respectively;
(4) for a change in sign in said determined differences changing the output signal by a predetermined amount in accordance with the change in sign, respectively; and
said filtering steps providing a filtered doppler velocity output signal from said sonar system.

* * * * *